United States Patent
Lee et al.

(10) Patent No.: US 7,369,442 B2
(45) Date of Patent: May 6, 2008

(54) ERASE DISCHARGE METHOD OF MEMORY DEVICE AND DISCHARGE CIRCUIT PERFORMING THE METHOD

(75) Inventors: Jin-Wook Lee, Seoul (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 11 days.

(21) Appl. No.: 11/303,557

(22) Filed: Dec. 15, 2005

(65) Prior Publication Data

US 2006/0250854 A1 Nov. 9, 2006

(30) Foreign Application Priority Data

May 4, 2005 (KR) .............. 10-2005-0037475

(51) Int. Cl.
*G11C 11/03* (2006.01)
(52) U.S. Cl. .............. 365/185.25; 365/185.2; 365/203
(58) Field of Classification Search ........... 365/185.25, 365/203, 185.2
See application file for complete search history.

(56) References Cited

U.S. PATENT DOCUMENTS

| | | | | |
|---|---|---|---|---|
| 5,822,247 A | * | 10/1998 | Tassan Caser et al. | . 365/185.18 |
| 6,344,992 B1 | * | 2/2002 | Nakamura | ........ 365/154 |
| 6,549,465 B2 | * | 4/2003 | Hirano et al. | ........ 365/185.23 |
| 2005/0286328 A1 | * | 12/2005 | Kurosaki et al. | ........ 365/203 |

FOREIGN PATENT DOCUMENTS

| | | |
|---|---|---|
| JP | 11-213684 | 8/1999 |
| JP | 2003-338186 | 11/2003 |
| JP | 2004-071067 | 3/2004 |

OTHER PUBLICATIONS

English language abstract of Japanese Publication 11-213684.
English language abstract of Japanese Publication 2003-338186.
English language abstract of Japanese Publication 2004-071067.

* cited by examiner

*Primary Examiner*—Pho M. Luu
(74) *Attorney, Agent, or Firm*—Marger Johnson & McCollom, P.C.

(57) ABSTRACT

A method for discharging an erase voltage of a semiconductor memory device and discharge circuit for performing the method, the method including performing a first discharge on a common source line (CSL) of the semiconductor memory device, comparing the detected CSL voltage with a predetermined reference voltage, and performing a second discharge on the CSL when the detected CSL voltage is lower than a predetermined reference voltage.

23 Claims, 3 Drawing Sheets

ERASE DISCHARGE METHOD OF MEMORY DEVICE AND DISCHARGE CIRCUIT PERFORMING THE METHOD

CROSS-REFERENCE TO RELATED PATENT APPLICATIONS

This application claims the benefit of Korean Patent Application No. 10-2005-0037475, filed on May 4, 2005, in the Korean Intellectual Property Office, the disclosure of which is incorporated herein in its entirety by reference.

BACKGROUND

1. Field of the Invention

This application relates to non-volatile semiconductor memory devices and, more particularly, to methods of discharging an erase voltage of a semiconductor memory device and semiconductor memory devices performing the methods.

2. Description of the Related Art

Semiconductor memory devices which are capable of electrically erasing or programming data stored therein without refreshing the data are required. Accordingly, studies on increasing the storage capacity and the degree of integration of semiconductor memory devices are underway. An example of a non-volatile semiconductor memory which provides both high capacity and high integration without refreshing the stored data is a NAND flash memory device.

Since NAND flash memory devices retain stored data when power is turned off, NAND flash memory devices are widely used for mobile terminals, notebook computers, etc. However, NAND flash memory devices need to discharge an erase voltage after erasing data.

A NAND flash memory device has a cell array including NAND strings. Each NAND string includes a series of cell transistors serially connected to each other. Specifically, each NAND string includes a first selection transistor, a plurality of cell transistors, and a second selection transistor serially connected to each other. The drain of the first selection transistor is connected to a corresponding bit line. Generally, all NAND strings in a column of the cell array share the same bit line. The second selection transistor has a source connected to a common source line (CSL) for a sector including the NAND string. The operation of discharging the NAND flash memory device can be performed in a discharge circuit for performing the discharge operation connected to the CSL.

FIG. 1 is a circuit diagram of a discharge circuit 100 of a conventional NAND flash memory device.

Referring to FIG. 1, the discharge circuit 100 includes a first node 106 connected to a CSL; a first high-voltage depletion transistor H1 connected between the first node 106 and a second node 108; a resistor R, a second high-voltage depletion transistor H2, and a first NMOS transistor N1 which are connected in series between the first node 106 and a ground voltage; a PMOS transistor P1 and a third high-voltage depletion transistor H3 which are connected in series between a supply voltage and the second node 108; and a second NMOS transistor N2 connected between the second node 108 and the ground voltage. The gates of the first and second high-voltage depletion transistors H1 and H2 are connected to the supply voltage and the gate of the third high-voltage depletion transistor H3 is connected to the ground voltage.

A program control signal 110 is applied to the gate of the PMOS transistor P1. The program control signal 110, a control signal applied when data is programmed to a memory cell, acts to apply a voltage lower than the supply voltage to the CSL. Accordingly, by setting the CSL to 1.2 V, it is possible to prevent coupling when data is programmed to a memory cell.

The first and second high-voltage depletion transistors H1 and H2 are used for protecting the first and second NMOS transistor N1 and N2, and the third high-voltage depletion transistor H3 is used for protecting the PMOS transistor P1.

A first discharge control signal 112 is applied to the gate of the first NMOS transistor N1 and a second discharge control signal 114 is applied to the gate of the second NMOS transistor N2.

The CSL shown in FIG. 1 is connected in common to NAND strings of NAND memory cells connected in series to each other in the NAND flash memory device not shown in FIG. 1.

FIG. 2 is a timing diagram of the first and second discharge control signals 112 and 114 shown in FIG. 1.

The operation of the conventional discharge circuit 100 will be described with reference to FIGS. 1 and 2.

When the NAND flash memory device programs memory cells, the CSL voltage is set to about 1.2 V. When the NAND flash memory device reads data from memory cells, the CSL voltage is set to 0 V. Also, when the NAND flash memory device erases data of the memory cells, the CSL voltage is set to a high voltage of about 20 V. Accordingly, after an erase operation is completed, the CSL must be discharged.

The conventional discharge method performs a second discharge when a predetermined time T elapses after a first discharge is performed through a resistor path.

As illustrated in FIG. 2, after data is completely erased, the first discharge control signal transits to logic 'high', and the second discharge control signal transits to logic 'high' after a predetermined time T elapses.

Referring to FIG. 1, if the first discharge control signal 112 transits to logic 'high', the first NMOS transistor N1 is turned on and the CSL is discharged through a first path 102 including the resistor R.

In the conventional discharge method, the timing relationship between a first discharge and a secondary discharge is set in advance. Therefore, if an erase time (tERS) is reduced, it is difficult to correctly decide on a restore time.

SUMMARY

An embodiment provides a method of discharging an erase voltage of a semiconductor memory device including performing a first discharge on a common source line (CSL) of the semiconductor memory device, comparing the detected CSL voltage with a predetermined reference voltage, and performing a second discharge on the CSL when the detected CSL voltage is lower than a predetermined reference voltage.

Another embodiment provides a discharge circuit of a non-volatile semiconductor memory device including a common source line (CSL) connected to memory cells of the non-volatile semiconductor memory, a first discharge controller to perform a first discharge on the CSL, a detector to compare a CSL voltage with a predetermined reference voltage and outputting a comparison result, and a second discharge controller to perform a second discharge on the CSL in response to the comparison result.

A further embodiment provides a semiconductor memory device including memory cells; a common source line (CSL) coupled to the memory cells; a first discharge circuit coupled to the CSL to perform a first discharge on the CSL; a second discharge circuit coupled to the CSL to perform a second discharge on the CSL in response to a discharge control signal; and a discharge control signal generator to generate the discharge control signal in response to a CSL voltage.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
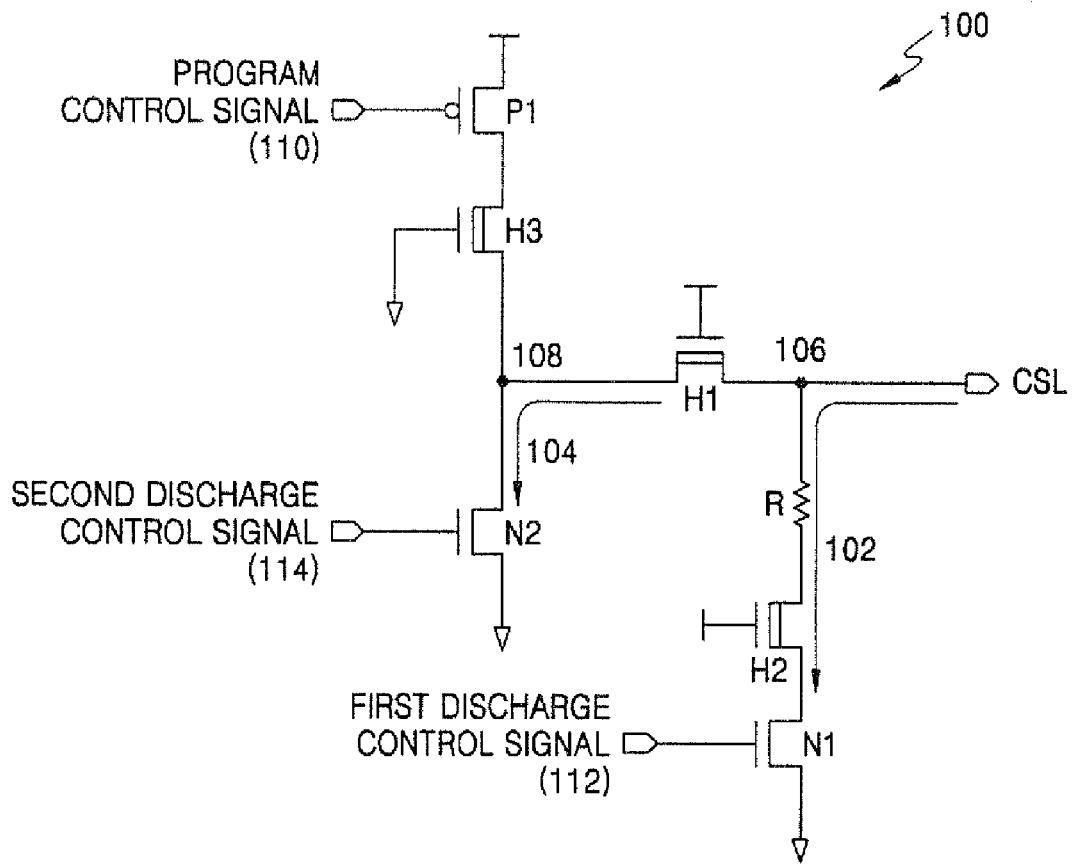
FIG. 1 is a circuit diagram of a discharge circuit of a conventional NAND flash memory device.
Figure 2:
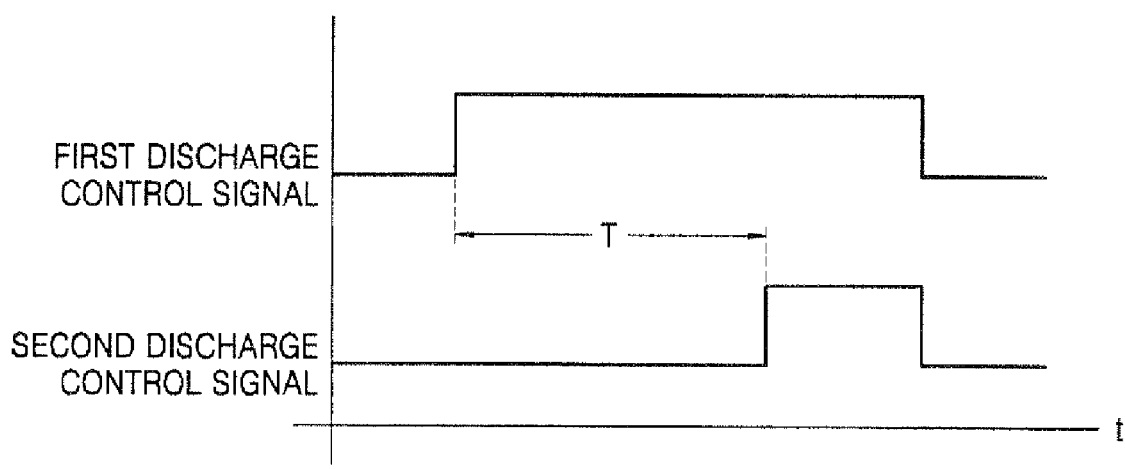
FIG. 2 is a timing diagram of first and second discharge control signals shown in FIG. 1.

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 3:
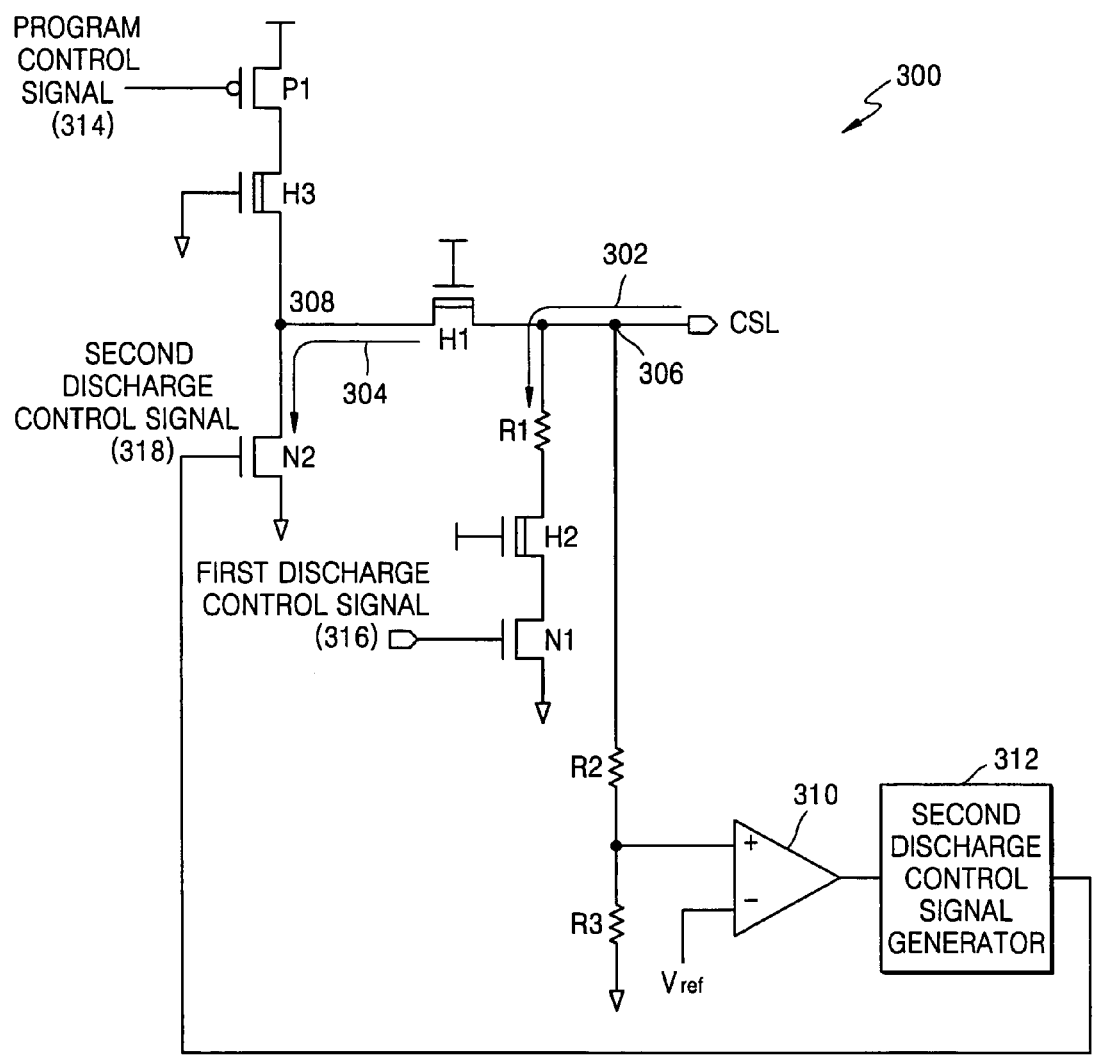
FIG. 3 is a circuit diagram of a discharge circuit of a NAND flash memory device, according to an embodiment.

FIG. 3 is a circuit diagram of a discharge circuit 300 of a NAND flash memory device, according to an embodiment of the present invention.

Referring to FIG. 3, the discharge circuit 300 includes a first node 306 connected to a common source line (CSL); a high-voltage depletion transistor H1 connected between the first node 306 and a second node 308; a first resistor R1, a second high-voltage depletion transistor H2, and a first NMOS transistor N1 connected in series between the first node 306 and a ground voltage; a PMOS transistor P1 and a third high-voltage depletion transistor H3 connected in series between a supply voltage and the second node 308; a second NMOS transistor N2 connected between the second node 308 and the ground voltage; second and third resistors R2 and R3 connected in series between the first node 306 and the ground voltage; a comparator 310 connected to a common node of the second and third resistors R2 and R3; and a discharge control signal generator 312 connected to the comparator 310.

The comparator 310 includes a first input terminal to which the output signal of the common node of the second and third resistors R2 and R3 is applied and a second input terminal to which a reference voltage signal $V_{ref}$ is applied. The comparator 310 compares the two signals and outputs the comparison result to the second discharge control signal generator 312. The second discharge control signal generator 312 generates a second discharge control signal 318 with a logic 'high' level in response to the comparison result of the comparator 310. Preferably, when the voltage of the common node of the second and third resistors R2 and R3 becomes lower than the reference voltage $V_{ref}$, the second discharge control signal generator 312 generates the second discharge control signal 318.

The gates of the first and second high-voltage depletion transistors H1 and H2 are connected to the supply voltage and the gate of the third high-voltage depletion transistor H3 is connected to the ground voltage.

A program control signal 314 is applied to the gate of the PMOS transistor P1. The program control signal 314, a control signal applied when data is programmed to a memory cell, turns on the PMOS transistor P1 to apply a predetermined voltage to the CSL.

The first and second high-voltage depletion transistors H1 and H2 may be used for protecting the first and second NMOS transistors N1 and N2 and the third high-voltage depletion transistor H3 is used for protecting the PMOS transistor P1.

A first discharge control signal 316 is applied to the gate of the first NMOS transistor N1 and a second discharge control signal 318 is applied to the gate of the second NMOS transistor N2. As described above, the second discharge control signal 318 is output from the second discharge control signal generator 312.

Figure 4:
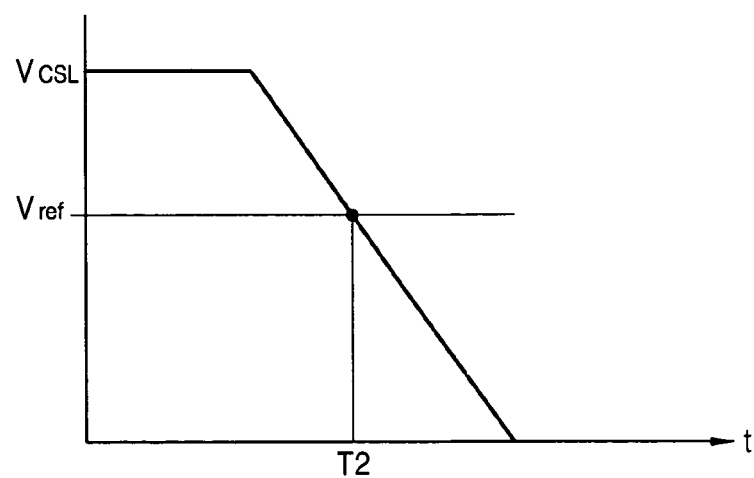
FIG. 4 is a graph illustrating a change in an input voltage according to a discharge operation in a comparator shown in FIG. 3.

FIG. 4 is a graph illustrating a change in an input voltage according to a discharge operation in the comparator 310 shown in FIG. 3.

The voltage $V_{csl}$ of the CSL is applied to the first input terminal of the comparator 310 through the resistor R2, and the reference voltage $V_{ref}$ is applied to the second input terminal of the comparator 310. When a first discharge is performed, the voltage $V_{csl}$ of the CSL begins to fall and the voltage at the first input terminal of the comparator begins to fall. Thus, when the voltage of the first input terminal becomes lower than the reference voltage $V_{ref}$ (at a time T2), the comparator 310 outputs the voltage comparison result to the second discharge control signal generator 312. The second discharge control signal generator 312 generates a second discharge control signal in response to the comparison result of the comparator 310.

The discharge circuit 300 detects a time T2 when the CSL voltage through the resistor R2 becomes lower than a predetermined voltage and generates a second discharge control signal after the time T2, instead of generating the second discharge control signal after a predetermined time T.

Figure 5:
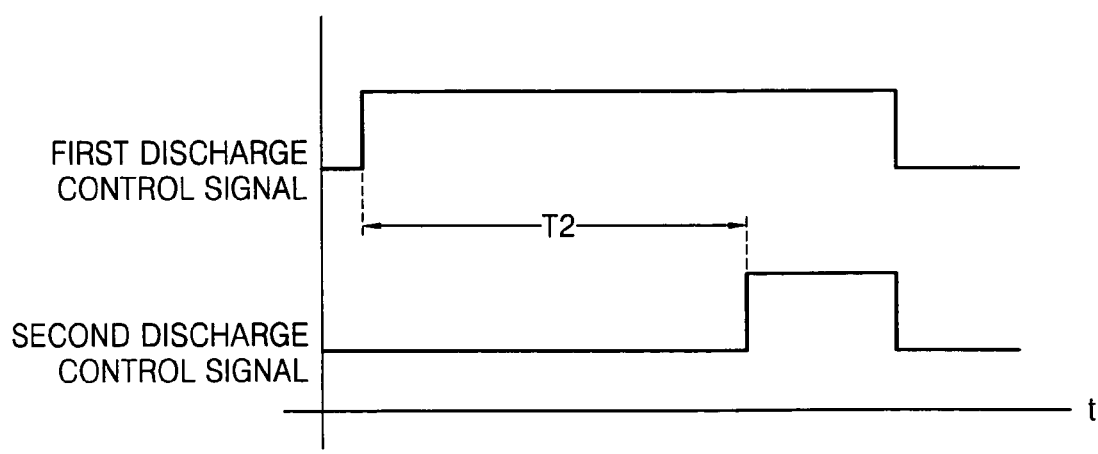
FIG. 5 is a timing diagram of discharge control signals used in the discharge circuit shown in FIG. 3.

FIG. 5 is a timing diagram of discharge control signals used in the discharge circuit 300 illustrated in FIG. 3. The operation of the discharge circuit 300 will be described with reference to FIGS. 3 through 5.

Referring to FIG. 5, if data is completely erased, a first discharge control signal transits to logic 'high' so to perform a first discharge.

Then, the first NMOS transistor N1 is turned on and the CSL is discharged through a first path 302 including the first resistor R1 (see FIG. 3). While the CSL is discharged, the CSL voltage falls as shown in FIG. 4, and the comparator 310 compares the voltage $V_{csl}$ of the CSL through resistor R2 with the reference voltage $V_{ref}$. When the voltage $V_{csl}$ of the CSL is lower than the reference voltage $V_{ref}$, the second discharge control signal generator 312 generates a second discharge control signal 318 to perform a second discharge.

When the second discharge is performed, the second discharge control signal is applied to the second NMOS transistor N2 and the second NMOS transistor N2 is turned on, so that the CSL is discharged through a second path 304.

According to a method of discharging an erase voltage, when an erase voltage is discharged, the voltage of a CSL is compared with a reference voltage $V_{ref}$ and a second discharge is performed when the CSL voltage is smaller than the reference voltage $V_{ref}$. Accordingly, it is possible to automatically detect an optimal timing when a second discharge may be performed and correctly decide a restore time when an erase time is reduced.

In other embodiments the first discharge and the second discharge may be simultaneously performed. However, it is also possible that the second discharge is performed at an arbitrary time after the first discharge is completed.

As described above, according to embodiments, it is possible to correctly detect a time when a second discharge may be performed after a first discharge is performed when data is erased, and to thus correctly decide a restore time.

Although a comparison of a CSL voltage and a reference voltage has been described, one of ordinary skill in the art will understand that the comparison may be performed through networks of components that may modify the CSL or reference voltages before comparison. For example, as described above, the CSL voltage is scaled by a resistor network before comparison to the reference voltage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of discharging an erase voltage of a semiconductor memory device comprising:
   performing a first discharge on a common source line (CSL) of the semiconductor memory device;
   comparing a CSL voltage with a reference voltage; and
   performing a second discharge on the CSL when the CSL voltage is lower than the reference voltage.

2. The method of claim 1, wherein performing the first discharge further comprises:
   generating a first discharge control signal when data is substantially erased;
   turning on a first switch in a first path in response to the first discharge control signal; and
   discharging the CSL through the first path.

3. The method of claim 2, wherein performing the second discharge further comprises:
   generating a second discharge control signal when the CSL voltage is lower than the reference voltage;
   turning on a second switch in a second path in response to the second discharge control signal; and
   discharging the CSL through the second path.

4. The method of claim 1, further comprising:
   terminating the first and second discharges when the CSL is substantially discharged;
   wherein performing the first discharge and performing the second discharge are substantially simultaneously performed.

5. The method of claim 1, further comprising:
   performing the second discharge begins when performing the first discharge terminates; and
   terminating the second discharge when the CSL substantially discharges.

6. The method of claim 1, wherein the semiconductor memory device is a non-volatile semiconductor memory.

7. The method of claim 6, wherein the non-volatile semiconductor memory is an NAND-type flash memory.

8. A discharge circuit of a non-volatile semiconductor memory device, comprising:
   a common source line (CSL) connected to memory cells of the non-volatile semiconductor memory;
   a first discharge controller to perform a first discharge on the CSL;
   a detector to compare a CSL voltage with a reference voltage and to output a comparison result; and
   a second discharge controller to perform a second discharge on the CSL in response to the comparison result.

9. The discharge circuit of claim 8, wherein the non-volatile semiconductor memory device is a NAND-type flash memory.

10. The discharge circuit of claim 8, further comprising:
    a first high-voltage depletion transistor connected between a first node and a second node, the first node connected to the CSL;
    the first discharge controller further including a resistor, a second high-voltage depletion transistor, and a first NMOS transistor connected in series with each other between the first node and a ground, a first discharge control signal applied to the gate of the first NMOS transistor; and
    the second discharge controller further including a second NMOS transistor connected between the second node and the ground, and a second discharge control signal, responsive to the comparison result, applied to the gate of the second NMOS transistor.

11. The discharge circuit of claim 10, wherein a supply voltage is applied to the gates of the first and second high-voltage depletion transistors.

12. The discharge circuit of claim 8, wherein
    the first discharge controller further to couple the CSL to a ground in response to a first discharge control signal; and
    the second discharge controller further to couple the CSL to the ground in response to a second discharge control signal, the second discharge control signal responsive to the comparison result.

13. The discharge circuit of claim 12, wherein the detector further comprises:
    a voltage comparator including a first input terminal to receive the CSL voltage, a second input terminal to receive the reference voltage, and an output terminal to output the comparison result; and
    a second discharge control signal generator coupled to the output terminal of the voltage comparator to generate the second discharge control signal.

14. The discharge circuit of claim 13, wherein the second discharge control signal generator further to generate the second discharge control signal when the CSL voltage is lower than the reference voltage.

15. The discharge circuit of claim 13, wherein the detector further comprises a voltage distribution unit including at least two resistors serially connected, one resistor coupled to the CSL, and a voltage output terminal of the voltage distribution unit coupled to the first input terminal of the voltage comparator.

16. The discharge circuit of claim 12, wherein:
    the first and second discharge control signals are to be simultaneously activated; and
    the first and second discharge control signals are to be disabled when the CSL is substantially discharged.

17. The discharge circuit of claim 12, wherein:
    the first discharge control signal is to be disabled if the second discharge control signal is activated, and
    the second discharge control signal is to be disabled when the CSL is completely discharged.

18. A semiconductor memory device comprising:
a plurality of memory cells;
a common source line (CSL) coupled to the memory cells;
a first discharge circuit coupled to the CSL to perform a first discharge on the CSL;
a second discharge circuit coupled to the CSL to perform a second discharge on the CSL in response to a discharge control signal; and
a discharge control signal generator to generate the discharge control signal in response to a CSL voltage.

19. The semiconductor memory device of claim 18, further comprising:
a detector circuit to generate a comparison result when the CSL voltage falls below a reference voltage; and
the discharge control signal generator further to generate the discharge control signal in response to the comparison result.

20. A method of discharging an erase voltage of a semiconductor memory device comprising:
performing a first discharge on a common source line (CSL) of the semiconductor memory device;
comparing a CSL voltage with a reference voltage; and
performing a second discharge on the CSL when the CSL voltage is lower than the reference voltage;
wherein performing the first discharge further comprises:
generating a first discharge control signal when data is substantially erased;
turning on a first switch in a first path in response to the first discharge control signal; and
discharging the CSL through the first path.

21. The method of claim 20, wherein performing the second discharge further comprises:
generating a second discharge control signal when the CSL voltage is lower than the reference voltage;
turning on a second switch in a second path in response to the second discharge control signal; and
discharging the CSL through the second path.

22. A method of discharging an erase voltage of a semiconductor memory device comprising:
performing a first discharge on a common source line (CSL) of the semiconductor memory device;
comparing a CSL voltage with a reference voltage;
performing a second discharge on the CSL when the CSL voltage is lower than the reference voltage; and
terminating the first and second discharges when the CSL is substantially discharged;
wherein performing the first discharge and performing the second discharge are substantially simultaneously performed.

23. A method of discharging an erase voltage of a semiconductor memory device comprising:
performing a first discharge on a common source line (CSL) of the semiconductor memory device;
comparing a CSL voltage with a reference voltage;
performing a second discharge on the CSL when the CSL voltage is lower than the reference voltage; and
terminating the second discharge when the CSL substantially discharges;
wherein performing the second discharge begins when performing the first discharge terminates.

* * * * *